United States Patent [19]

Hu et al.

[11] 4,145,699

[45] Mar. 20, 1979

[54] SUPERCONDUCTING JUNCTIONS UTILIZING A BINARY SEMICONDUCTOR BARRIER

[75] Inventors: Evelyn L. Hu, Somerset; Lawrence D. Jackel, Morganville, both of N.J.

[73] Assignee: Bell Telephone Laboratories, Incorporated, Murray Hill, N.J.

[21] Appl. No.: 888,330

[22] Filed: Mar. 20, 1978

Related U.S. Application Data

[63] Continuation-in-part of Ser. No. 858,389, Dec. 7, 1977, abandoned.

[51] Int. Cl.² .............................................. H01L 39/22
[52] U.S. Cl. ........................................... 357/5; 357/4; 307/212; 307/306
[58] Field of Search ................ 357/5, 4; 307/212, 306

[56] References Cited

U.S. PATENT DOCUMENTS

| | | | |
|---|---|---|---|
| 3,697,826 | 10/1972 | Mitani | 317/234 |
| 3,702,956 | 11/1972 | Renard et al. | 317/234 R |
| 3,751,721 | 12/1971 | Fulton | 317/234 |
| 3,816,173 | 6/1974 | Eldridge | 117/217 |

OTHER PUBLICATIONS

Jutzi, *I.B.M. Tech. Discl. Bull.*, vol. 16, No. 6, Nov. 1973, p. 2020.

*Primary Examiner*—Martin H. Edlow
*Attorney, Agent, or Firm*—Bruce S. Schneider

[57] ABSTRACT

Superconductor junctions adaptable for applications such as logic circuitry and magnetic flux detection are disclosed. These junctions utilize superconducting electrodes with a semiconductor barrier composed of a binary composition of germanium and tin. The composition of this binary composition strongly affects the electrical properties of the device. For example, when using two Sn electrodes, if the Sn/Ge ratio in the barrier is changed from 1:4 to 1:1 for a thickness of 600 Å, the electrical properties of the junction transform from hysteretic to non-hysteretic characteristics.

11 Claims, 5 Drawing Figures

SUPERCONDUCTING JUNCTIONS UTILIZING A BINARY SEMICONDUCTOR BARRIER

CROSS REFERENCE TO RELATED APPLICATION

This application is a continuation-in-part of copending application, Ser. No. 858,389, filed Dec. 7, 1977, now abandoned.

BACKGROUND OF THE INVENTION

1. Field of the Invention

This invention relates to superconductor junctions and, more particularly, to such junctions utilizing semiconductor materials as barriers.

2. Art Background

Superconducting junctions, i.e., Josephson junctions which are formed by having a barrier layer between two superconducting electrodes are presently being investigated for various uses, e.g., high speed switches in logic circuits and magnetometers. A number of possible geometries for these devices have been explored. Of the various possibilities, the Josephson junction in a sandwich geometry is often preferred because of its general ease of fabrication. In this type junction a superconductor layer, a barrier layer, and another superconductor layer are successively formed on a substrate. This fabrication method generally is advantageous because it requires a limited number of processing steps.

Within the constraints of the sandwich geometry, a variety of electrical properties have been obtained. For example, both hysteretic and non-hysteretic junctions have been developed and are contemplated for use in high-speed switching circuits. Each type has certain distinct attributes, and neither, as yet, is clearly preferred. For example, hysteretic junctions have large current gains relative to non-hysteretic ones. However, once a hysteretic junction is switched, the junction does not revert to its original state. Typically to reset the switch, the biasing current on the junction must be lowered and then raised again for the next switching operation. The greater the degree of hysteresis, the more the bias current must be lowered before it is returned to its initial level. This necessity for varying the applied current bias may become burdensome especially in highly hysteretic junctions.

Non-hysteretic junctions, on the other hand, return to their original state without bias current changes, i.e., the biasing current during operation is not changed. The use of a constant biasing current simplifies logic circuit design and is also important in applications, such as magnetometry where extremely rapid sampling speeds are necessary. However, the current gain of non-hysteretic junctions is usually lower than that of its hysteretic counterpart. As a result, more complicated circuit design with its corresponding inconvenience is required to produce adequate current transfer.

Two other factors, junction switching speed and junction resistance, in addition to hysteresis, are important in circuitry design. To transfer the most current to the load driven by the junction, it is desirable to have the resistance of the junction approximately equal to, or preferably larger than, the resistance of the load to be driven. Additionally, since the inductive time delay associated with the external circuit varies inversely with load resistance, it is desirable to use a high resistance load. The desirability of high resistance loads compounds the need for junctions with higher resistances to maintain adequate current transfer from the activated switch to the load.

Junction switching speed is also an important consideration for circuitry applications. For nonhysteretic junctions, the RC time constant of the junction is not a significant limitation on switching speed. However, for highly hysteretic junctions, the RC time constant can become a quite significant limitation. These circuitry considerations involving hysteresis, resistance and switching speed have spurred current research toward producing junctions with high resistances which are nonhysteretic or which have limited hysteresis. (The extent of hysteresis can be defined by the ratio $I_r/I_c$ where $I_c$ is the critical current, i.e., the current needed to produce a voltage across the electrodes of the junction, and $I_r$ is the value to which the bias current must be lowered in order to reset the junction when used as a switch. Ratios greater than about $10^{-4}$ indicate limited hysteresis.)

The hysteresis and resistance of a device are determined by three physical properties of the junction: (1) the critical current density, i.e., the current per unit area needed to produce a voltage across the electrodes of the junction, (2) the area of the junction and (3) the capacitance per unit area of the junction. Resistance is inversely dependent on (1) and (2) and hysteresis is inversely dependent on (1) and linearly dependent on (3). For typical capacitances and current densities, the area of a junction often cannot be decreased sufficiently to produce suitable resistances for adequate current transfer between the junction and the load. Therefore, obtaining more acceptacle capacitances and critical current densities is essential to simultaneously achieving relatively high resistances and relatively low hysteresis.

The superconducting electrode material of a junction usually has a somewhat limited effect on capacitance and critical current density, and thus on the ultimate properties such as resistance and hysteresis. In contradistinction, the material used as the barrier layer has a strong influence. Metal oxides, e.g., tin oxide, are a prominent type of barrier material. Satisfactory junctions have been produced using superconductor electrodes of tin metal and barriers of tin oxide. To afford adequate current flow through the barrier material, these metal oxide junctions are made with a thin barrier layer. Barrier layers this thin, or even thinner, are also needed to produce the higher critical current densities essential for lower hysteresis. However, the use of these thin barrier layers, and thus higher critical current densities, tends to produce a relatively low resistance.

To avoid this problem, some junctions have been made with semiconductor materials as barriers. The semiconductor barriers can be much thicker than their metal oxide counterparts and still afford acceptable resistances for junction areas. Because the layers are thicker, capacitance tends to be lower, and the possibility of obtaining no or acceptably low hysteresis is increased. Attempts to make junctions with semiconductor barriers have not been entirely satisfactory. For example, a device with a silicon barrier has been made. (See Huang and Van Duzer, *IEEE Trans. Mag., Mag*-11 (2), 766 (1975).) This device is fabricated by producing a thin highly doped layer over a major surface of a single crystal of silicon. A pit is then etched from the undoped side of the silicon crystal down to, but not into, the highly doped layer. The doped layer and the surfaces of the etched pit are then coated with a superconductor. The difficulty of fabrication mitigates a significant advantage of sandwich geometry junctions and probably precludes large scale manufacturing. Other Josephson devices incorporating a tellurium barrier or a germanium barrier have been reported. (See Seto and Van Duzer, *Appl. Phys Letts.*, 19 (11), 488 (1971) and Giaever and Zeller, *Physical Review Letters*, 21, 1385 (1968).) However, the electrical properties of these devices have not been entirely explored.

SUMMARY OF THE INVENTION

Josephson Junctions having the manufacturing advantages of the sandwich geometry while displaying the desirable electrical properties associated with a semiconductor barrier have been made. Additionally, the hysteretic properties of the inventive junctions are adjustable by changing the composition of the barrier — a degree of freedom not achievable with previous schemes for superconducting junctions. The barrier is composed of a binary composition of germanium and tin. Using superconducting electrodes, such as Sn, In, or Pb, junctions with a variety of electrical properties have been obtained. By adjusting the ratio of tin to germanium in the barrier layer, the extent of hysteresis is controllable. For example, for a device having Sn electrodes and a 600 A barrier layer with a 1:1 Ge/Sn ratio, junctions with no measurable hysteresis are produced, while for the same electrodes and barrier thicknesses, ratios in the range 2:1 produce junctions with hysteresis representative of the better metal oxide devices ($I_r/I_c$ on the order of $10^{-4}$ or higher). Further, the measured resistance, approximately 0.1 ohms for such a junction having a $10^{-5}$ cm$^2$ area, is a value indicating acceptable current transfer in logic circuitry where junctions of $10^{-6}$ cm$^2$ area or smaller are typically used.

DETAILED DESCRIPTION

In the preferred embodiment of the invention, the junctions are made in sandwich configurations with superconducting electrodes of materials such as Sn, Pb or In and with a Sn/Ge barrier. For pedagogic purposes the remainder of the specification describes preparation of the inventive junctions in the sandwich geometry. Although this configuration generally requires the fewest processing steps, other possible geometries utilizing superconducting electrodes and the same binary barrier are possible and are fabricated using conventional techniques.

Since the inventive junctions are composed of thin layers, the entire device is built upon a substrate. This substrate may be any of a number of materials, e.g., sapphire, provided certain general criteria are satisfied. First, the substrate should have a low electrical conductivity less than about $10^{-4}$ (ohm-cm)$^{-1}$ at the junction operating temperature to prevent shorts between the electrodes when both sets of electrodes are deposited directly on the substrate. Second, the coefficient of expansion of the substrate in the temperature range used during fabrication must be sufficiently close to the coefficient of expansion of the material deposited directly upon the substrate to insure adhesion. Exemplary of suitable substrates is sapphire.

Before the device is deposited on the substrate, the substrate should be cleaned to promote a uniformly deposited layer. Conventional cleaning processes are employed for this purpose. For example, in the case of sapphire, the substrate is cleaned by rinsing in successive baths of acetone, methanol, and distilled - deionized water.

A superconducting layer which functions as one of the electrodes is first deposited on the substrate. The superconducting material used to make this layer is not critical. Superconductors such as Sn, In, Pb or superconductor materials containing these elements are suitable. The particular electrodes used do to a certain extent influence the electrical properties of the final device. For example, the voltage step associated with the energy gaps in the electrode varies (typically from approximately 1mV to approximately 2mV) with electrode material. However, as discussed later, the composition of the barrier layer, unlike the base electrode, has a significant affect on important electrical properties, hysteresis and resistance. The method used to deposit the base electrode is not critical. However, it is desirable to form a uniform layer of small grain size. The small grain size helps uniformity in the subsequently deposited layers.

Figure 1:
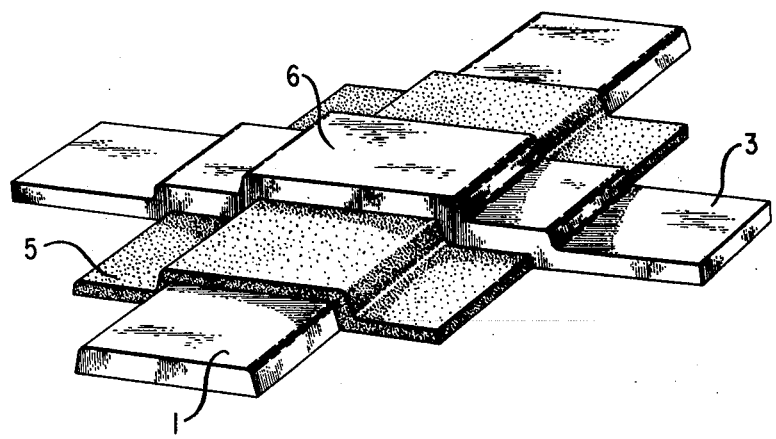
FIG. 1 shows a schematic top view of the junctions of the invention.

An exemplary method for depositing this superconducting electrode is the Dolan oblique evaporation technique. (See *Applied Physics Letters*, 31, 337 (1977).) This method produces a superconducting layer with tapered or feathered edges. A layer of photoresist is first deposited on the substrate. This layer is exposed and a layer of aluminum deposited on the exposed resist. A second layer of resist material is deposited and exposed in the shape of the electrode. This layer is developed and the aluminum which is uncovered after developing is etched away. This uncovers the initial resist layer which is covered with developers until a small portion of the resist under the aluminum is dissolved. The superconducting electrode layer is then deposited through this mask and the mask is removed. To insure deposition at the undercut portions of the Al, the substrate is held at an angle to the source and is rotated around an axis perpendicular to the major surface. Although tapered edges are not essential to the practice of the invention, they promote subsequent deposition of a uniform, continuous layer. The thickness of this superconducting layer should be between approximately 700 and 3000 Å. Thicknesses less than 700 Å tend to be electrically discontinuous or are difficult to produce uniformly. For convenience in making electrical contact to external circuitry, the base superconducting electrode layer is generally deposited on less than the entire substrate and is typically formed in a strip, along one of the major axes in the plane of the major surface of the substrate. (See FIG. 1, where the strip is denoted 1.) The width of this strip depends on the area desired for the final junction. The width is made commensurate with the junction area desired.

After the base electrode is deposited, the binary Ge/Sn barrier layer, 5, is subsequently deposited. This binary composition should be essentially a single phase, i.e., while small phase crystallites are acceptable, large scale phase separation degrades properties. Substrates are maintained at relatively low temperatures since higher temperatures may cause melting of materials used in the base electrode such as tin or possibly large scale phase separation of the barrier material. Typically temperatures between 30 degrees C. and room temperature are satisfactory.

The barrier layer is deposited by conventional techniques. The use of molecular beam epitaxy (MBE) is particularly convenient since the ratio of Ge to Sn is controlled simply by picking suitable temperatures for the respective sources. For a typical MBE apparatus, temperatures for the Ge source in the range between 1030 and 1330, preferably between 1130 and 1280 degrees C. are used. Similarly, for the Sn source, temperatures between 980 and 1280, preferably between 1100 and 1200 degrees C. are employed.

It is also possible to deposit the barrier layer by using a single source MBE apparatus. The ratio of the elements Ge/Sn which is inserted in the source depend on the temperature to be used and their relative vapor pressures. The Ge/Sn ratio used in the source to produce a desired barrier composition is determined to a close approximation by the method described in L. Holland, *Vacuum Deposition of Thin Films*, J. Wiley & Sons, N.Y. (1960) 185. The exact proportions necessary to produce a given Sn/Ge ratio in the barrier layer is then ascertained by using a controlled sample.

The specific source temperatures used depend on the ultimate ratio of Ge to Sn which is desired and to an extent depends on the particular geometry of the MBE apparatus. Exemplary of temperatures utilized when two sources are employed are 1222 degrees C. for the Ge source and 1130 degrees C. for the Sn source in a molecular beam apparatus with two ceramic resistively heated sources aligned perpendicularly to a vertical substrate holder. These temperatures for this equipment give a barrier material with a 2:1 ratio of Ge to Sn. For higher ratios, for example, 4:1, temperatures of approximately 1270 degrees C. for the Ge source and 1130 degrees C. for the Sn source are employed. In the same apparatus, when a single source containing both Ge and Sn is utilized, a temperature of 1154 degrees C. for a starting mixture of 20 parts Ge to 1 part Sn by weight is used to obtain a barrier composition of approximately 2:1. For a barrier composition of approximately 1.4:1 a temperature of 1270 degrees C. is used with a 13:1 (by weight) Ge/Sn ratio in the source. A controlled sample is used to determine the specific temperatures for a given apparatus and a given Ge/Sn ratio.

The thickness of the barrier material influences the ultimate electrical properties of the junction. The thicker the barrier layer the smaller the capacitance of the junction and the lower the hysteresis. Additionally, the Sn/Ge ratio also affects the extent of hysteresis — the greater the percentage of Sn the lower the hysteresis. The extent of hysteresis is established by a combination of layer thickness and Sn/Ge composition and, as discussed later, to a lesser extent by the particular top superconducting electrode used. Generally, barrier thicknesses between 25 and 1000 Å preferably between 300 and 700 Å are used. Thicker barriers tend to degrade electrical properties while thinner layers tend to yield discontinuous coverage.

The Sn/Ge ratio is set in conjunction with layer thickness and in view of the material used for the top superconducting electrodes to yield the desired capacitance and critical current density. However, Sn/Ge ratios having less tin than 1:10 are usually not acceptable because impractically low current densities for most purposes are obtained. A generally useful range of compositions is Sn/Ge ratios of 1:10 to 3:2. Exemplary of possible Sn/Ge and thickness combinations is a barrier with a 1:1 Sn/Ge ratio and a thickness of 600 Å yields a non-hysteretic junction for Sn electrodes while a 1:2 ratio and the same thickness yields a hysteretic junction with $I_r/I_c$ on the order of about $10^{-3}$. When a Pb top electrode and a tin base electrode as used with a 1:1 barrier ratio, (360 Å thick) an $I_r/I_c$ of about 0.15 is obtained.

After the barrier layer is deposited, the newly formed binary composition should be exposed to an oxidizing atmosphere. This can be done by the simple expedient of removing the substrate with its deposited layers from the deposition apparatus into the ambient atmosphere. However, other similar techniques are useful. Although it has been observed that this exposure to an oxidizing atmosphere is necessary to obtain the best junction properties, the basis for this step is not as yet understood. It is contemplated that the exposure helps insulate segments of the base electrode which are exposed through possible pinholes in the barrier.

After the deposited binary layer is exposed to an oxidizing atmosphere, the top electrode, 3, is deposited. This electrode is a superconducting material. The same material as used in the base electrode or a different superconductor is usable. For example, superconducting materials, such as indium, lead, tin or superconductors containing these elements, are suitable as the top electrode. The electrical properties of the device are, to a certain extent, dependent on the particular material used as the second top electrode. For example, when a Pb second electrode, instead of an Sn electrode, is used in an otherwise similar device, the devices tend to have a greater degree of hysteresis than when a Sn top electrode is used. A lead top electrode with a barrier 360 Å thick having a 1:1 composition typically yields an $I_r/I_c$ of about 0.15 as compared to a similar device with a Sn top electrode which has an $I_r/I_c$ about 1. The exact reason for the effect of the top electrode on hysteresis is unclear. A contemplated theory is that lead has a higher vapor pressure than Sn and thus has a lower kinetic energy when it reaches the barrier layer during the deposition process. The Pb, therefore, does not interact with the oxide layer formed on the barrier as effectively as Sn and does not contact the barrier itself as well. It is possible to compensate for the effect of the top electrode by varying the barrier composition. For example, if a lesser degree of hysteresis is desired, the Sn/Ge ratio is increased. A limitation on this compensation is that phase separation of the Sn/Ge barrier by an excessive proportion of Sn must be avoided.

To deposit the top electrode, conventional techniques such as evaporation are generally used. The desired thickness range of the second electrode is the same as discussed for the base electrode deposited directly on the supporting substrate. For ease of making electrical contact the second electrode is deposited perpendicularly to the base electrode. The overlap area, 6, between the two electrodes is considered the effective area of the device. The desired area and the width of the base electrode determines the width of this second electrode.

Electrical contact between the junction and external circuitry is made by any of a number of expedient methods. For example, the extreme areas of both electrodes are covered with a silver paste. Separate indium wires are then embedded in the paste.

The following examples are illustrative of typical processing parameters and techniques used to fabricate the inventive junctions.

EXAMPLE 1

Figure 4:
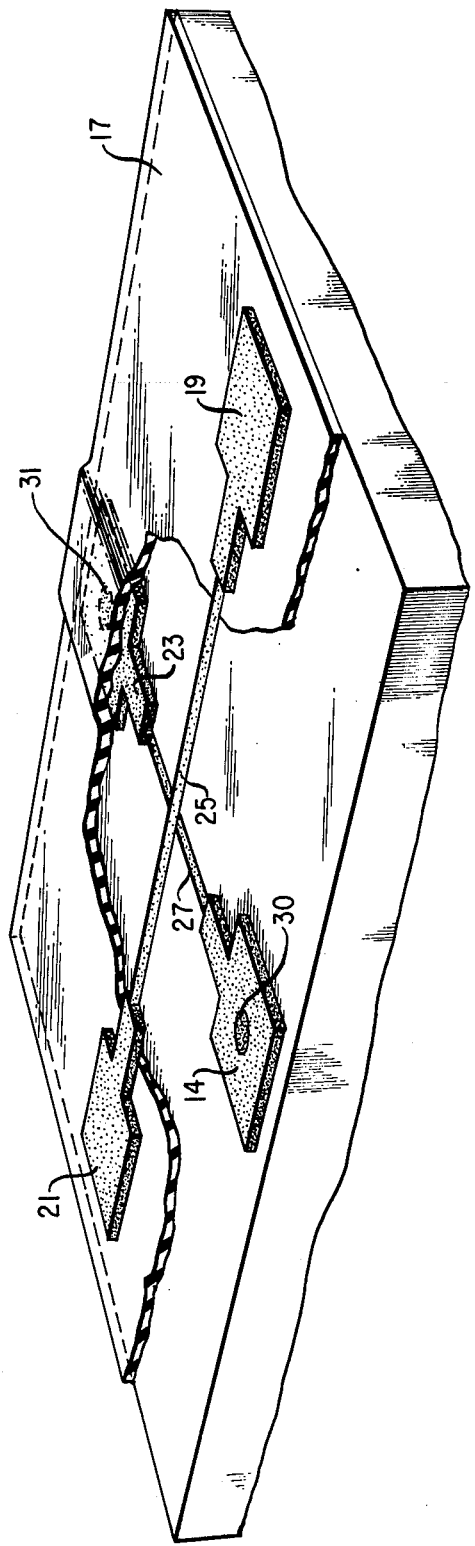
FIG. 4 shows a view in perspective of an embodiment of the inventive junctions.

The Dolan oblique technique was used to deposit the first Sn electrode on a 0.25 in. thick sapphire substrate measuring 1.0 in. by 0.5 in. The entire substrate was spin coated with a 1.5μ thick coating of Shipley AZ-1350J photoresist (a proprietary positive photoresist.) A blanket exposure of the resist was made using a mercury arc lamp for 30 seconds to produce the photoreaction throughout the resist. The resist was then baked at 80 degrees C. for ½ hour. An aluminum layer 50 Å thick was evaporated onto the resist layer. Another layer 1.5μ thick of the same photoresist was coated onto the aluminum layer by spinning. The entire substrate and coatings were baked at 80 degrees C. for about 30 minutes. This second resist layer was then exposed with a mercury arc lamp for 8 seconds in a rectangular pattern 0.2 cm by 50μ in dimension (27 in FIG. 4) with each end of this rectangular section having a 0.2 cm$^2$ square portion, appended as shown in FIG. 4 at 14 and 23. The exposed resist was then developed with 1:1 solution of Shipley AZ developer (a proprietary developer made for the photoresist used) and distilled water. The portion of the aluminum layer uncovered by this exposure is then etched off using a 5% $HNO_3$/5% acetic acid/5% $H_2O$/85% phosphoric acid solution by covering the Al layer for about 20 sec. at 40 degrees C. The substrate was rinsed in distilled water. The etched pit was then filled with the same developer until a region in the initial resist layer of about 5μ on each side of the edge of the etched Al was dissolved from under the aluminum layer and down to the substrate. The coated substrate was then placed in the sample holder of an evaporation apparatus. The holder was positioned at an angle of 30 degrees, from a normal to the substrate, and was separated from the Sn evaporation source by a shutter. The Sn was held in a tungsten boat which was heated by electrical resistance. The entire apparatus was evacuated to a pressure of approximately $3 \times 10^{-6}$ Torr by using a mechanical rough pump followed by a Varian VacIon pump. The substrate was rotated at 10 rpm around the normal to the substrate. The temperature of the Sn source containing 99.999% pure Sn was raised until a Sn deposition rate of approximately 100 Å/sec was obtained as measured by a quartz crystal monitor. The shutter was removed and the evaporation was allowed to proceed until a layer thickness of approximately 2000 Å was measured on a quartz crystal monitor. The shutter was closed and the evaporation process was ended. The coated substrate was then removed from the evaporation station and the photoresist and offsetting layers were dissolved with acetone. A dot of silver paste, 30 and 31, was placed on each of the end members, 14 and 23, of the electrodes.

The substrate was then placed in a vertical sample holder of a MBE apparatus. This apparatus, manufactured by Varian, basically was composed of a source having two resistively heated cylindrical ceramic containers positioned about 2 in. from the sample holder whose axis of rotation was aligned perpendicularly to the vertical sample holder. The sample holder was rotatable and initially it was positioned so that the coated side of the substrate faced 90 degrees away from the sources. The apparatus was evacuated to a pressure of $10^{-7}$ Torr. Then an argon atmosphere of approximately $2 \times 10^{-5}$ Torr was introduced. Using this argon atmosphere the Sn layer was bombarded with Argon ions to remove any oxide coat. The argon ions were produced using a heated filament ion gun source which was located in the deposition chamber. The argon atmosphere was then removed and the apparatus was evacuated to a $10^{-7}$ Torr pressure using a cold-trap, a VacIon pump and a Ti-sublimation pump. A Bruce temperature controller (an electrical bridge balancing mechanism with a thermocouple sensor) was used to control the heating of the Ge and Sn ovens to temperatures of approximately 1169 and 1130 degrees C., respectively. After these temperatures were achieved, a shutter between the source and substrate was opened and the substrate was rotated into position. The deposition continued for a period of approximately 15 minutes to produce a layer of 600 Å thickness, 17. The shutter was then again closed and the deposition process discontinued. The substrate was removed from the apparatus and exposed to the atmosphere for a period of approximately ½ hour.

A stainless steel mask having an open area in the form desired for the second Sn electrode was placed over the substrate to mask the deposited layers. The mask was approximately 1 mil thick and had an open central region measuring approximately $2.5 \times 10^{-3}$ cm by 1.0 cm to form member, 25, of the electrode. The mask also had open portions to form members, 19 and 21. The substrate and mask were then inserted in an evaporation apparatus. A 2000 Å thick Sn layer was then evaporated onto the barrier material using the same conditions employed for deposition of the first Sn electrode except no rotation or oblique evaporation is necessary.

Figure 2:
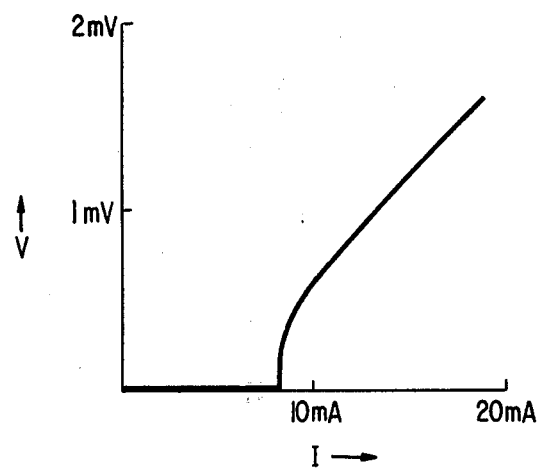
FIGS. 2, 3, and 5 show I-V curves for embodiments of the invention.

Electrical connections were made by applying Ag paste to the non-overlapping regions, 19 and 21, of the upper Sn electrode. Separate indium wires were then embedded in the paste and covered by a further layer of silver paste. Indium wires were also pushed through the barrier layer and into the silver paste, 30 and 31, on electrode regions, 23 and 14. This procedure produced a junction of cross-sectional area $10^{-5}$ cm$^2$ having a barrier region approximately 600 Å thick composed of a Ge and Sn composition in the ratio 1:1. The electrical properties as measured by the four-point probe method are shown in FIG. 2. As can be seen, the junction exhibited no hysteresis and has a resistance of approximately 0.1 ohms.

EXAMPLE 2

Figure 3:
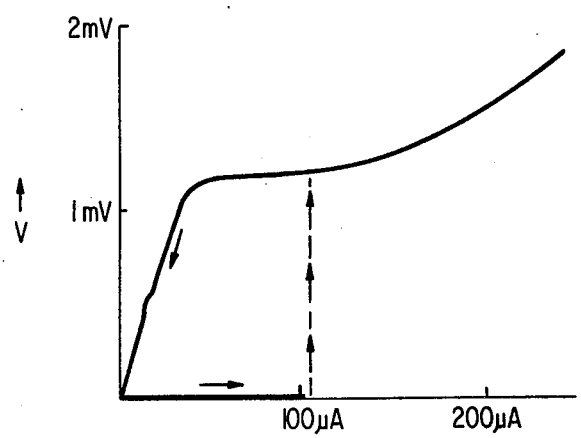

The same procedure was followed as that described in Example 1, except during the MBE deposition of the barrier layer Ge and Sn source temperatures of 1222 and 1130 degrees C., respectively, for 10 min. were utilized and the width of the upper tin electrode was $2 \times 10^{-2}$ cm. This produced a 600 Å thick layer having a 1:2 Sn to Ge ratio. The properties of this junction were measured as described in Example 1 and the I-V characteristics are shown in FIG. 3. The junction generally had hysteresis characteristics equivalent to those of better metal oxide junctions. The resistance of the junction was approximately 10 ohm for an area of $10^{-4}$ cm$^2$.

EXAMPLE 3

Figure 5:
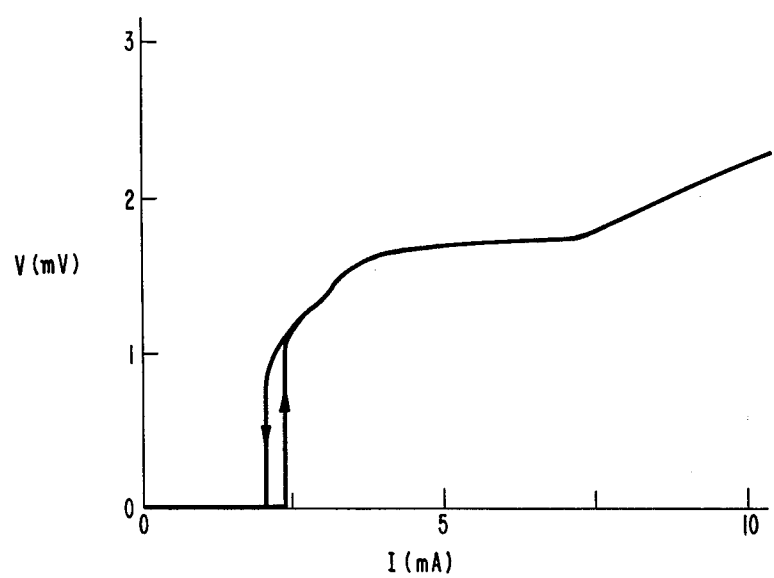

The same procedure was followed as that described in Example 1 except a Pb base electrode was utilized instead of a tin one. The Pb electrode was deposited by the same procedure to produce a 1500 Å thick layer. Additionally, during the MBE deposition of the barrier layer, Ge and Sn source temperatures were 1169 and 1130 degrees C., respectively. This produced a 400 Å thick layer having a 2:3 Sn/Ge ratio. The composition obtained is slightly different than previous examples because the sources in the MBE apparatus had been realigned between experiments. The properties of this junction were measured as described in Example 1 and the I-V characteristics are shown in FIG. 5. The junction has a $I_r/I_c$ of approximately 0.95 and a resistance of 0.2 ohms at 2 degrees K for an area of $2.6 \times 10^{-6} cm^2$.

We claim:

1. A Josephson junction comprising a semiconductor barrier material in intimate contact with two superconducting electrodes CHARACTERIZED IN THAT said semiconductor barrier material comprises a binary composition of Ge and Sn.

2. The Josephson junction of claim wherein at least one of said superconducting electrodes contains Pb.

3. The Josephson junction of claim 1 wherein at least one of said superconducting electrodes contains In.

4. The Josephson junction of claim 1 wherein at least one of said superconducting electrodes contains Sn.

5. The Josephson junction of claim 1 wherein said binary composition has a Ge/Sn ratio in the range 10:1 to 2:3.

6. A superconductor junction comprising a semiconductor barrier material in intimate contact with two superconducting electrodes, CHARACTERIZED IN THAT said superconducting electrodes each consist essentially of tin and said semiconductor barrier material comprises a binary composition of Ge and Sn.

7. The superconductor junction of claim 6 wherein said binary composition has a Ge/Sn ratio in the range between 10:1 and 2:3.

8. The superconductor junction of claim 7 wherein said ratio is approximately 1:1.

9. The superconductor junction of claim 7 wherein said ratio is approximately 2:1.

10. The superconductor junction of claim 6 wherein said ratio is in the range of about 1:1 to 4:1.

11. A superconductor junction comprising a supporting substrate having deposited thereon in succession (1) a Sn layer, (2) binary composition of Ge and Sn, and (3) a Sn layer.

* * * * *

UNITED STATES PATENT AND TRADEMARK OFFICE
CERTIFICATE OF CORRECTION

PATENT NO. : 4,145,699

DATED : March 20, 1979

INVENTOR(S) : Evelyn L. Hu and Lawrence D. Jackel

It is certified that error appears in the above-identified patent and that said Letters Patent are hereby corrected as shown below:

Column 2, line 32, "acceptacle" should read --acceptable--.
Column 4, line 64, after "small" insert --single--.
Column 6, line 6, "as" should read --are--.
Column 9, claim 2, line 18, after "claim" insert --1--.

Signed and Sealed this

Thirty-first Day of July 1979

[SEAL]

Attest:

Attesting Officer

LUTRELLE F. PARKER

Acting Commissioner of Patents and Trademarks